(12) United States Patent
Tseng (10) Patent No.: US 10,878,741 B2
(45) Date of Patent: Dec. 29, 2020

(54) LIGHT EMITTING DIODE DISPLAY DEVICE AND PIXEL MOUNTING METHOD

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Te-En Tseng, New Taipei (TW)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/959,365

(22) Filed: Apr. 23, 2018

(65) Prior Publication Data

US 2019/0266938 A1    Aug. 29, 2019

Related U.S. Application Data

(60) Provisional application No. 62/636,104, filed on Feb. 27, 2018.

(51) Int. Cl.
 *G09G 3/32* (2016.01)
(52) U.S. Cl.
 CPC .......... *G09G 3/32* (2013.01); *B32B 2307/202* (2013.01)

(58) Field of Classification Search
 CPC ............................ G09G 3/32; B23B 2307/202
 See application file for complete search history.

(56) References Cited

U.S. PATENT DOCUMENTS

| 2006/0202931 A1* | 9/2006 | Koide ................ G02F 1/1362 |
| | | 345/90 |
| 2007/0139393 A1* | 6/2007 | Nakanishi ............ G06F 3/045 |
| | | 345/173 |
| 2012/0119626 A1* | 5/2012 | Takahashi ........... G06F 3/044 |
| | | 310/363 |
| 2019/0088196 A1* | 3/2019 | Chu ...................... G09G 3/32 |
| 2019/0181191 A1* | 6/2019 | Chen ................. H01L 27/3218 |

FOREIGN PATENT DOCUMENTS

| CN | 104658438 | 5/2015 |
| CN | 106683574 | 5/2017 |
| TW | 530476 | 10/2016 |

\* cited by examiner

*Primary Examiner* — Peter D McLoone
(74) *Attorney, Agent, or Firm* — ScienBiziP, P.C.

(57) ABSTRACT

A light emitting diode display device includes a substrate, a conductive film, and a pixel layer. The conductive film is formed on the substrate. The pixel layer is formed on the conductive film by which the pixel electronically connects to the substrate. The pixel layer includes a number of pixels. The number of pixels have a staggered arrangement and are arranged on the conductive film as a matrix.

20 Claims, 7 Drawing Sheets

LIGHT EMITTING DIODE DISPLAY DEVICE AND PIXEL MOUNTING METHOD

CROSS-REFERENCE TO RELATED APPLICATIONS

This application claims priority to U.S. provisional Patent Application No. 62/636,104 filed on Feb. 27, 2018, the contents of which are incorporated by reference herein.

FIELD

The instant disclosure relates generally to displays, and pertains particularly to a light emitting diode display device and a pixel mounting method.

BACKGROUND

An Anisotropic Conductive Adhesive (ACA) has unidirectional conductive function and adhesive glue function and is widely used in panel industry. For example, the ACA can be used in FPC, LED for electronic connection. However, in Micro LED field, as the LED pixel is too small, the common ACA is not able to meet the requirement. Thus, an ultra-micro matrix column type ACF is developed and used in the LED panel. The anisotropic conductive rubber of the ACA however, has a size limit. When the anisotropic conductive rubber of the ACA is applied beyond the size limit, the pressing conditions of the anisotropic conductive rubber, such as temperature and pressure, become more severe, which causes cracking of the substrate of LED device in processing.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 1:
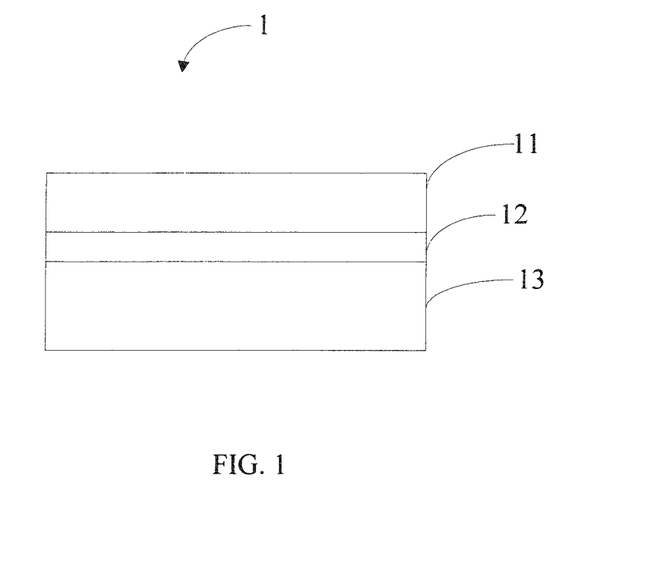
FIG. 1 illustrates a schematic diagram of a light emitting diode display device.

FIG. 1 illustrates a schematic diagram of a light emitting diode display device 1. In one embodiment, the light emitting diode display device 1 includes a pixel layer 11, a conductive film 12, and a substrate 13. The conductive film 12 is formed on the substrate 13, and the pixel layer 11 is formed on the conductive film 12. The pixel layer 11 electronically connects to the substrate 13 through the conductive film 12. In this embodiment, the substrate 13 may be a silicon substrate or a glass substrate. In another embodiment, the substrate 13 may be flexible and ductile. For example, the substrate 13 may include an organic material selected from a group including polyethersulfone (PES), polyarylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), cellulose acetate propionate (CAP), and so on.

Figure 2:
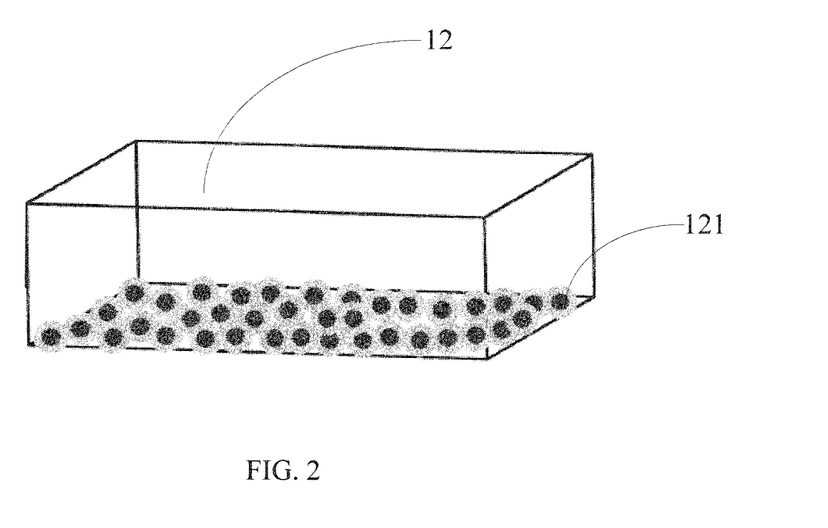
FIG. 2 is a schematic diagram illustrating a conductive film in the display device of FIG. 1.

FIG. 2 illustrates the conductive film 2 of FIG. 1. The conductive film 12 is made of Anisotropic Conductive Adhesive (ACA). In at least one example embodiment, the conductive film 12 includes a plurality of conductive rubber particles 121. The plurality of conductive rubber particles 121 are arranged as a matrix. The plurality of conductive rubber particles 121 may be anisotropic conductive rubber particles. The particle size of the conductive rubber particle 121 is about 2.5 um. The space between two of the plurality of conductive rubber particles 121 is about 1.5 um. In one embodiment, an insulator, such as a polymer material, is filled into the conductive film 12 to prevent the plurality of conductive rubber particles 121 from connecting electrically to each other.

Figure 3:
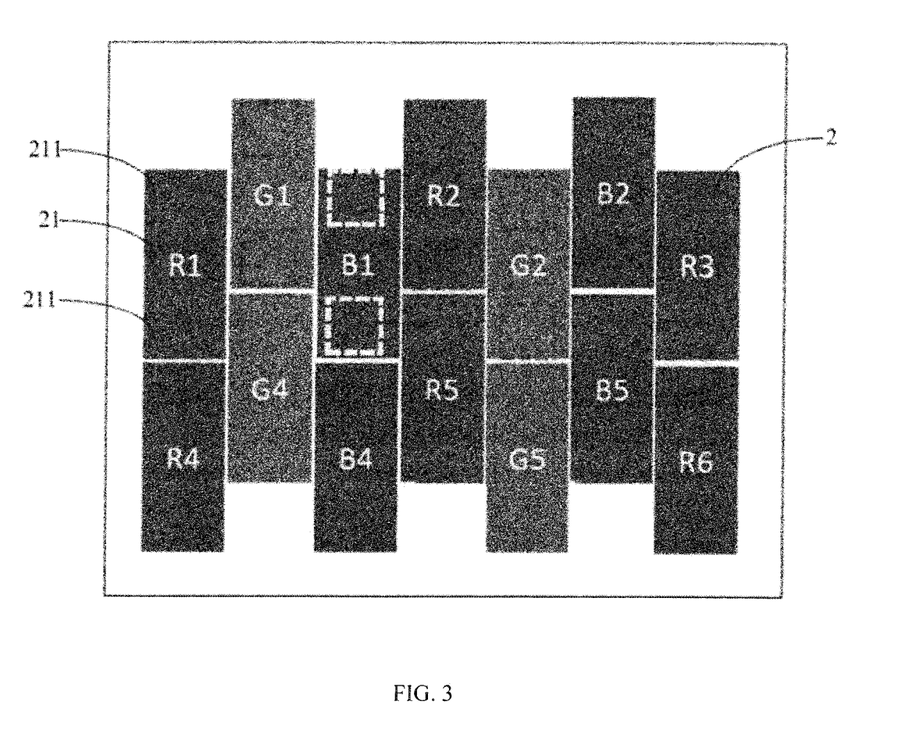
FIG. 3 is a schematic diagram illustrating a pixel layer in the display device of FIG. 1.

FIG. 3 illustrates the pixel layer 11. The pixel layer 11 includes a plurality of pixels 2. The pixels 2 of the pixel layer 11 have a staggered arrangement and are arranged as a matrix. In one embodiment, each pixel 2 includes a tube core 21. Each tube core 21 includes two electrodes 211. The tube core 21 includes red light tube core, green light tube core, and blue light tube core. The staggered pixels 2 of the pixel layer 11 increase the space between the electrodes 211 of the pixel layer 11 to ensure that each electrode 211 of the tube core 21 is able to electronically connect to one of the plurality of conductive rubber particle 121 of the conductive film 12. The requirements for the electrodes 211 of the pixel layer 11 to electronically connect to the conductive film 12 are thus met.

Figure 4:
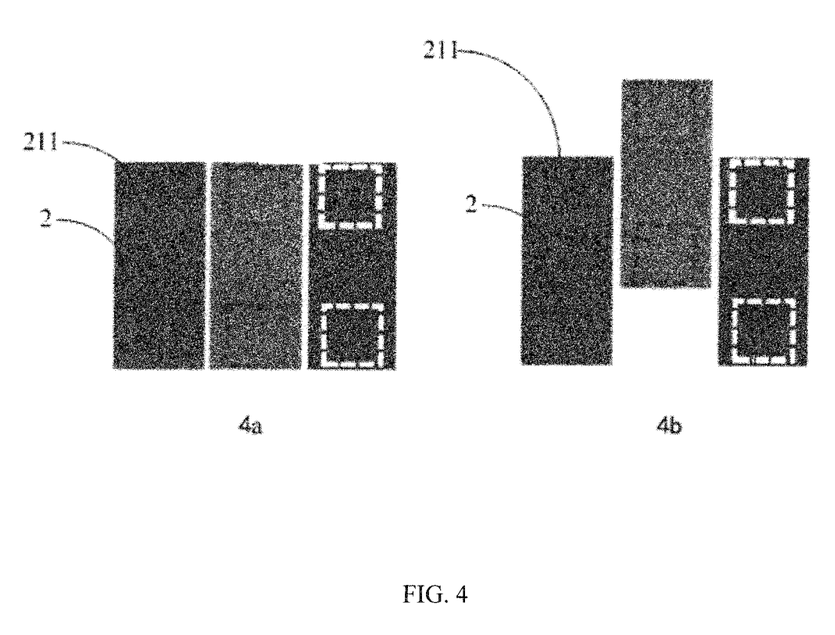
FIG. 4 is a schematic diagram illustrating a pixel of the pixel layer of FIG. 4.

FIG. 4a illustrates pixels 2 which are not staggered and are arranged as a matrix. In FIG. 4a, the pixels 2 in adjacent columns of the matrix are not staggered. Since such pixels 2 are not staggered, when a requirement for reducing the size of pixel is needed, a distance between two electrodes 211 on two adjacent columns of the matrix may be less than a distance between two conductive rubber particle 121 of the conductive film 12. As a result, not all the electrodes 211 of the pixel layer 11 are connected to one of the plurality of conductive rubber particle 121 of the conductive film 12. Thus, the electrodes 211 of the pixel layer 11 are not able to connect electrically to the substrate 13 through the conductive film 12. FIG. 4b illustrates pixels 2 which are staggered and are arranged as a matrix. In FIG. 4b, the pixels 2 on adjacent columns of the matrix are staggered. Since such pixels 2 on adjacent columns of the matrix are staggered, when a requirement for reducing the size of pixel is needed, the distance between two electrodes 211 of the staggered pixels 2 on adjacent columns of the matrix is more than the distance between two electrodes 211 of the unstaggered pixels 2 on adjacent columns of the matrix. Such distance is more than the distance between two conductive rubber particle 121 of the conductive film 12, which makes all the electrodes 211 of the pixel layer 11 connect to at least one conductive rubber particle 121 of the conductive film 12. Thus, the electrodes 211 of the pixel layer 11 are able to connect electrically to the substrate 13 through the conductive film 12.

Figure 5:
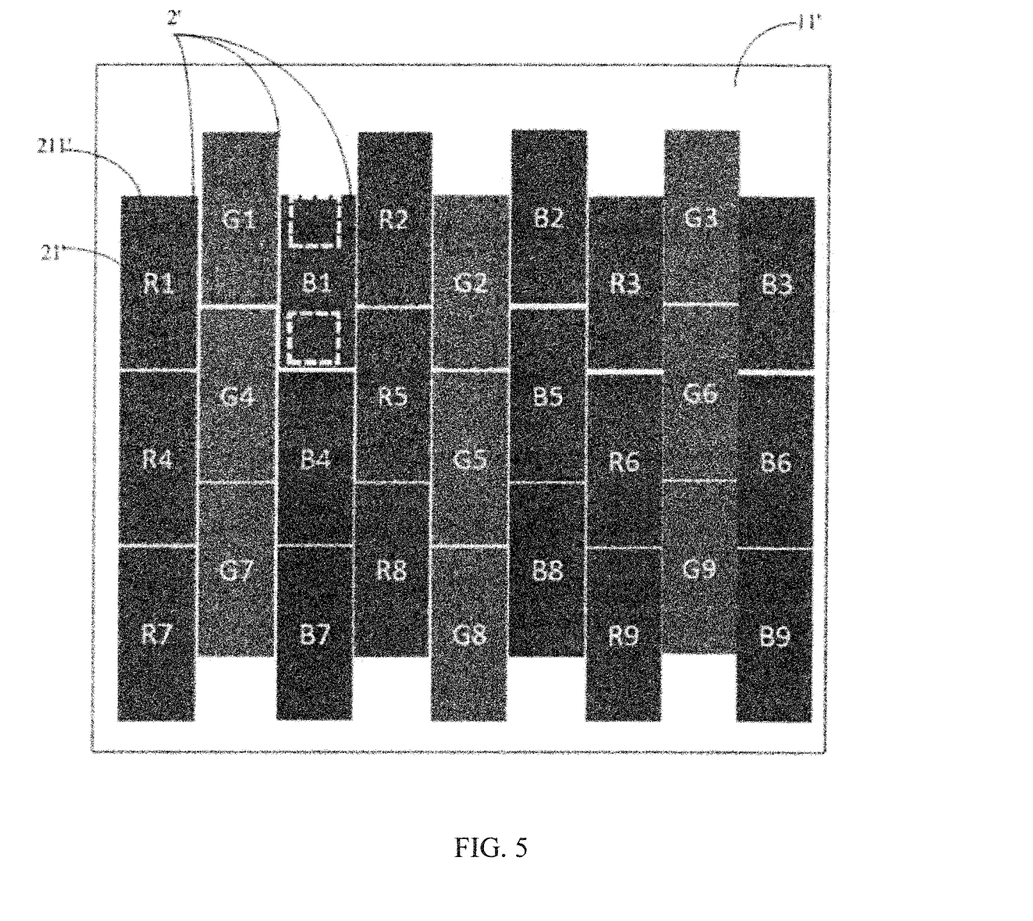
FIG. 5 is another schematic diagram illustrating a pixel layer in the display device of FIG. 1.

FIG. 5 illustrates another schematic diagram of the pixel layer 11'. The pixel layer 11' includes a plurality of pixels 2'. Each pixel 2' includes three tube cores 21'. The three tube cores 21' of each pixel 2' are staggered in relation to each other. In one embodiment, each tube core 21' includes two electrodes 211', and the three tube cores 21' can be red light tube core, green light tube core, and blue light tube core. In one embodiment, as the three tube cores 21' of each pixel 2' are staggered and the pixels 2' on adjacent columns of the matrix are staggered, when a requirement for reducing the size of pixel is needed, the distance between two electrodes 211' of the staggered pixels 2' on adjacent columns of the matrix and the distance between two electrodes 211' on each pixel 2' are both more than the distance between two conductive rubber particle 121 of the conductive film 12. Therein, all the electrodes 211' of the pixel layer 11' connect to at least one conductive rubber particle 121 of the conductive film 12. Thus, the electrodes 211' of the pixel layer 11' are able to connect electrically to the substrate 13 through the conductive film 12.

Figure 6:
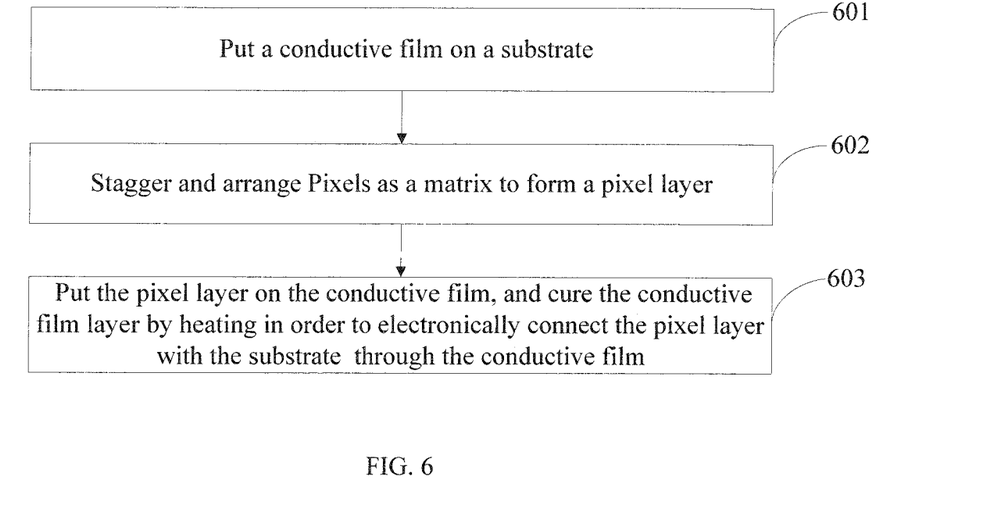
FIG. 6 is a flowchart of a pixel mounting method.

FIG. 6 illustrates a flowchart of one embodiment of a pixel mounting method. The pixel mounting method is applied in the light emitting diode display device 1. The method is provided by way of example, as there are a variety of ways to carry out the method. The method described below can be carried out using the configurations illustrated in FIGS. 1-5, for example, and various elements of these figures are referenced in explaining the example method. Each block shown in FIG. 6 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block 601.

At block 601, a conductive film is put on a substrate. In one embodiment, the substrate may be a silicon substrate or a glass substrate. The conductive film is made of the Anisotropic Conductive Adhesive. In one embodiment, the conductive film includes a plurality of conductive rubber particles. The conductive rubber particles are arranged as a matrix. The size one of the conductive rubber particles is about 2.5 um. The space between two of the plurality of conductive rubber particle is about 1.5 um.

At block 602, a plurality of pixels which are staggered and are arranged as a matrix form a pixel layer. In one embodiment, each pixel includes a tube core. Each tube core includes two electrodes. The tube core includes red light tube core, green light tube core, and blue light tube core. In one embodiment, as the pixels on adjacent columns of the matrix are staggered, the distance between two electrodes of the staggered pixels on adjacent columns of the matrix is more than the distance between two electrodes of the unstaggered pixels on adjacent columns of the matrix. This distance is also greater than the distance between two conductive rubber particle of the conductive film. Thus, the electrodes of the pixel layer are able to connect electrically to the substrate through the conductive film.

At block 603, the pixel layer is put on the conductive film, and the conductive film layer is cured by heating or pressing in order to electronically connect the pixel layer with the substrate through the conductive film.

In one embodiment, the method further includes an insulating polymer material being included in the conductive film to prevent the plurality of conductive rubber particles from connecting electrically to each other.

Figure 7:
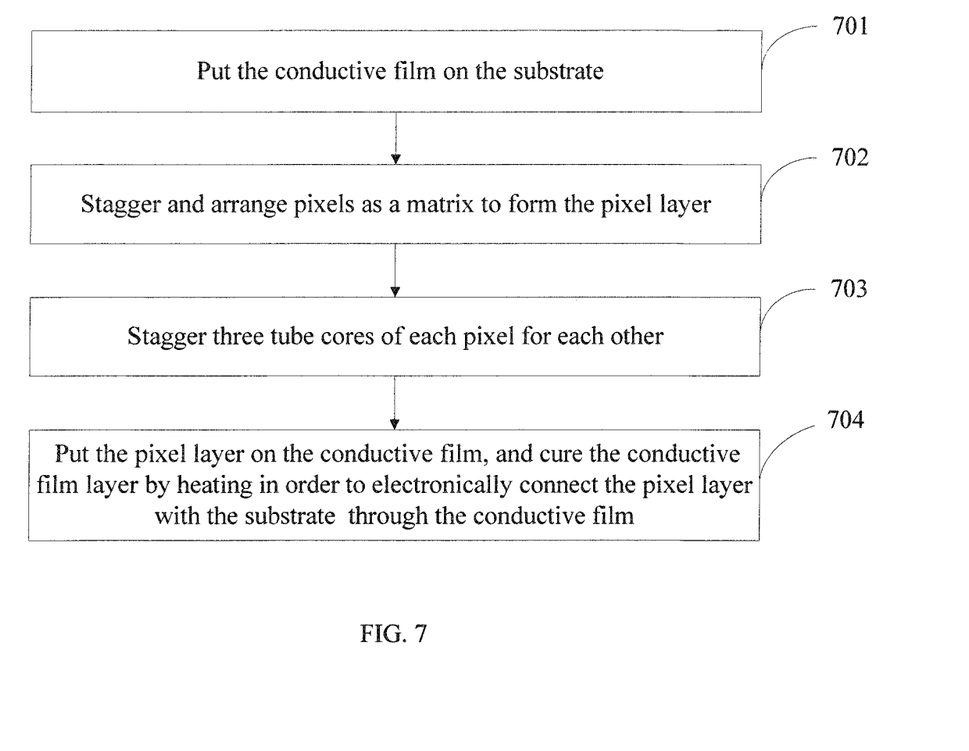
FIG. 7 is a flowchart of another pixel mounting method.

FIG. 7 illustrates a flowchart of another embodiment of a pixel mounting method. Each block shown in FIG. 7 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block 701.

At block 701, the conductive film is put on the substrate.

At block 702, the pixels which are staggered and are arranged as a matrix form the pixel layer. The pixel layer includes a plurality of pixels. Each pixel includes three tube cores. In one embodiment, each tube core includes two electrodes, and the three tube cores can be red light tube core, green light tube core, and blue light tube core.

At block 703, the three tube cores of each pixel are staggered in relation to each other. In one embodiment, as the three tube cores of each pixel are staggered and the pixels on adjacent columns of the matrix are staggered, when a reduced pixel size is required, the distance between two electrodes of the staggered pixels on adjacent columns of the matrix and the distance between two electrodes on each pixel are both more than the distance between two conductive rubber particles of the conductive film. In this case, all the electrodes of the pixel layer connect to at least one conductive rubber particle of the conductive film. Thus, the electrodes of the pixel layer are able to connect electrically to the substrate through the conductive film.

At block 704, the pixel layer is put on the conductive film, and the conductive film layer is cured by heating or pressing in order to electronically connect the pixel layer with the substrate through the conductive film.

In one embodiment, the method further includes an insulating polymer material being included in the conductive film to prevent the conductive rubber particles from connecting electrically to each other.

The exemplary embodiments shown and described above are only examples. Even though numerous characteristics and advantages of the present disclosure have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A light emitting diode display device comprising:
a substrate;
a conductive film formed on the substrate; and
a pixel layer formed on the conductive film by which the pixel layer electronically connects to the substrate, wherein the pixel layer comprises a plurality of pixels, the plurality of pixels have a staggered arrangement and are arranged on the conductive film as a matrix, each pixel comprises three tube cores, each tube core comprises first and second electrodes opposite to each other in a first direction and a core portion between the first and second electrodes, the three tube cores of a first pixel of the plurality of the pixels are a red light tube core, a green light tube core, and a blue light tube core, the red light tube core, the green light tube core, and the blue light tube core are staggered in relation to each other in a row of the matrix, the plurality of pixels are staggered both on adjacent columns of the matrix and on adjacent rows of the matrix, the first electrode of the red light tube core, the core portion of the green light tube core, and the first electrode of the blue light tube core are aligned with each other in a second direction transverse to the first direction, and the second electrode of the red light tube core is aligned with the second electrode of the blue light tube core in the second direction.

2. The light emitting diode display device as recited in claim 1, wherein the conductive film comprises a plurality of conductive rubber particles which are arranged as a matrix, the conductive film is made of Anisotropic Conductive Adhesive, and the plurality of conductive rubber particles are anisotropic conductive rubber particles.

3. The light emitting diode display device as recited in claim 2, wherein the particle size of the conductive rubber particle is 2.5 um, the space between two of the plurality of conductive rubber particles is 1.5 um.

4. The light emitting diode display device as recited in claim 2, wherein the conductive film further fills into a plurality of insulators to prevent the number of conductive rubber particles from connecting electrically to each other.

5. The light emitting diode display device as recited in claim 2, wherein the staggered pixels of the pixel layer increase the space between the electrodes of the pixel layer to ensure that each electrode of the tube core electronically connects to one of the plurality of conductive rubber particles of the conductive film.

6. The light emitting diode display device as recited in claim 2, wherein a distance between two electrodes of the staggered pixels on adjacent columns of the matrix and the distance between two electrodes on each pixel are more than the distance between two conductive rubber particles of the conductive film.

7. The light emitting diode display device as recited in claim 1, wherein the substrate can be is a silicon substrate or a glass substrate.

8. The light emitting diode display device as recited in claim 1, wherein:
the three tube cores of a second pixel of the plurality of the pixels are a first light tube core, a second light tube core, and a third light tube core;
the core portion of the first light tube core, the first electrode of the second light tube core, and the core portion of the third light tube core are aligned with each other in the second direction;
the first electrode of the first light tube core is aligned with the first electrode of the third light tube core in the second direction; and
the second electrode of the first light tube core is aligned with the second electrode of the third light tube core in the second direction.

9. A pixel mounting method comprising:
putting a conductive film on a substrate;
making a plurality of pixels which are staggered and are arranged as a matrix to form a pixel layer;
putting the pixel layer on the conductive film; and
curing the conductive film by heating or pressing to electronically connect the pixel layer with the substrate through the conductive film, wherein each pixel comprises three tube cores, each tube core comprises first and second electrodes opposite to each other in a first direction and a core portion between the first and second electrodes, the three tube cores of a first pixel of the plurality of the pixels are a red light tube core, a green light tube core, and a blue light tube core, the red light tube core, the green light tube core, and the blue light tube core are staggered in relation to each other in a row of the matrix, the plurality of pixels are staggered both on adjacent columns of the matrix and on adjacent rows of the matrix, the core portion of the red light tube core, the first electrode of the green light tube core, and the core portion of the blue light tube core are aligned with each other in a second direction transverse to the first direction, the first electrode of the red light tube core is aligned with the first electrode of the blue light tube core in the second direction, and the second electrode of the red light tube core is aligned with the second electrode of the blue light tube core in the second direction.

10. The pixel mounting method as recited in claim 9, wherein the staggered pixels of the pixel layer increase the space between the electrodes of the pixel layer to ensure that each electrode of the tube core electronically connects to one of the plurality of conductive rubber particle of the conductive film.

11. The pixel mounting method as recited in claim 9, wherein the conductive film comprises a plurality of conductive rubber particles which are arranged as a matrix, the conductive film is made of Anisotropic Conductive Adhesive, the plurality of conductive rubber particles are anisotropic conductive rubber particles.

12. The pixel mounting method as recited in claim 11, wherein the method further comprising:
filling a plurality of insulators into the conductive film to prevent the plurality of conductive rubber particles from connecting electrically to each other.

13. The pixel mounting method as recited in claim 9, wherein:
the three tube cores of a second pixel of the plurality of the pixels are a first light tube core, a second light tube core, and a third light tube core;
the first electrode of the first light tube core, the core portion of the second light tube core, and the first electrode of the third light tube core are aligned with each other in the second direction; and
the second electrode of the first light tube core is aligned with the second electrode of the third light tube core in the second direction.

14. A light emitting diode display device comprising:
a substrate;
a conductive film formed on the substrate; and
a pixel layer formed on the conductive film and including a first pixel, wherein:
- the first pixel includes first, second, and third light tube cores, each of which has first and second electrodes opposite to each other in a first direction and a core portion between the first and second electrodes thereof;
- the core portion of the first light tube core, the first electrode of the second light tube core, and the core portion of the third light tube core are aligned with each other in a second direction transverse to the first direction;
- the first electrode of the first light tube core is aligned with the first electrode of the third light tube core in the second direction; and
- the second electrode of the first light tube core is aligned with the second electrode of the third light tube core in the second direction.

15. The light emitting diode display device as recited in claim 14, wherein:
- the pixel layer further includes a second pixel;
- the second pixel includes first, second, and third light tube cores, each of which has first and second electrodes opposite to each other in the first direction and a core portion between the first and second electrodes thereof;
- the first light tube core of the second pixel has the same color as the first light tube core of the first pixel; and
- the first electrode of the first light tube core of the second pixel is aligned with the core portion of the first light tube core of the first pixel in the second direction.

16. The light emitting diode display device as recited in claim 14, wherein:
- the pixel layer further includes a second pixel;
- the second pixel includes first, second, and third light tube cores, each of which has first and second electrodes opposite to each other in the first direction and a core portion between the first and second electrodes thereof;
- the third light tube core of the second pixel has the same color as the third light tube core of the first pixel; and
- the first electrode of the third light tube core of the second pixel is aligned with the core portion of the first light tube core of the first pixel in the second direction.

17. The light emitting diode display device as recited in claim 14, wherein:
- the pixel layer further includes a second pixel;
- the second pixel includes first, second, and third light tube cores, each of which has first and second electrodes opposite to each other in the first direction and a core portion between the first and second electrodes thereof;
- the first light tube core of the second pixel has the same color as the first light tube core of the first pixel; and
- the first electrode of the first light tube core of the second pixel is aligned with the core portion of the third light tube core of the first pixel in the second direction.

18. The light emitting diode display device as recited in claim 14, wherein:
- the pixel layer further includes a second pixel;
- the second pixel includes first, second, and third light tube cores, each of which has first and second electrodes opposite to each other in the first direction and a core portion between the first and second electrodes thereof;
- the third light tube core of the second pixel has the same color as the third light tube core of the first pixel; and
- the first electrode of the third light tube core of the second pixel is aligned with the core portion of the third light tube core in the second direction.

19. The light emitting diode display device as recited in claim 14, wherein:
- the pixel layer further includes a second pixel;
- the second pixel includes first, second, and third light tube cores, each of which has first and second electrodes opposite to each other in the first direction and a core portion between the first and second electrodes thereof;
- the first light tube core of the second pixel has the same color as the first light tube core of the first pixel; and
- the core portion the first light tube core of the second pixel is aligned with the core portion of the second light tube core of the first pixel in the second direction.

20. The light emitting diode display device as recited in claim 14, wherein:
- the pixel layer further includes a second pixel;
- the second pixel includes first, second, and third light tube cores, each of which has first and second electrodes opposite to each other in the first direction and a core portion between the first and second electrodes thereof;
- the third light tube core of the second pixel has the same color as the third light tube core of the first pixel; and
- the core portion the third light tube core of the second pixel is aligned with the core portion of the second light tube core of the first pixel in the second direction.

* * * * *